United States Patent
Arai et al.

(10) Patent No.: US 10,472,728 B2
(45) Date of Patent: Nov. 12, 2019

(54) COPPER FOIL FOR PRINTED CIRCUIT

(71) Applicant: JX Nippon Mining & Metals Corporation, Tokyo (JP)

(72) Inventors: Hideta Arai, Ibaraki (JP); Atsushi Miki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 391 days.

(21) Appl. No.: 15/178,620

(22) Filed: Jun. 10, 2016

(65) Prior Publication Data

US 2016/0286665 A1 Sep. 29, 2016

Related U.S. Application Data

(63) Continuation of application No. 13/635,147, filed as application No. PCT/JP2011/052276 on Feb. 3, 2011, now Pat. No. 9,580,829.

(30) Foreign Application Priority Data

May 7, 2010 (JP) .................................. 2010-107251

(51) Int. Cl.
C23C 28/00 (2006.01)
C25D 15/00 (2006.01)
(Continued)

(52) U.S. Cl.
CPC ............. *C25D 7/0614* (2013.01); *C25D 5/12* (2013.01); *C25D 5/16* (2013.01); *C25D 15/00* (2013.01);
(Continued)

(58) Field of Classification Search
CPC ..... C23C 14/024; C23C 28/00; C23C 28/021; C23C 28/028; C25D 5/10
(Continued)

(56) References Cited

U.S. PATENT DOCUMENTS 4,014,756 A 3/1977 Fromson
4,159,231 A 6/1979 Smith
(Continued)

FOREIGN PATENT DOCUMENTS

GB 1558919 1/1980
JP S57-087324 A 5/1982
(Continued)

*Primary Examiner* — Edna Wong
(74) *Attorney, Agent, or Firm* — Howson & Howson LLP

(57) ABSTRACT

A copper foil for printed circuits is prepared by forming a primary particle layer of copper on a surface of a copper foil, and then forming a secondary particle layer based on ternary alloy composed of copper, cobalt and nickel on the primary particle layer. The average particle size of the primary particle layer is 0.25 to 0.45 μm, and the average particle size of the secondary particles layer based on ternary alloy composed of copper, cobalt and nickel is 0.05 to 0.25 μm. Provided is a copper foil for printed circuits, in which powder fall from the copper foil can be reduced and the peeling strength and heat resistance can be improved by forming a primary particle layer of copper on a surface of a copper foil, and then forming a secondary particle layer based on copper-cobalt-nickel alloy plating on the primary particle layer.

26 Claims, 3 Drawing Sheets

(51) Int. Cl.

| | | |
|---|---|---|
| *C25D 7/06* | (2006.01) | |
| *C25D 5/10* | (2006.01) | |
| *C25D 5/12* | (2006.01) | |
| *H05K 3/38* | (2006.01) | |
| *C25D 5/16* | (2006.01) | |
| *H05K 1/09* | (2006.01) | |
| *H05K 3/20* | (2006.01) | |
| *C25D 1/04* | (2006.01) | |
| *C25D 3/38* | (2006.01) | |
| *C25D 3/56* | (2006.01) | |
| *C25D 3/58* | (2006.01) | |
| *C25D 9/04* | (2006.01) | |

(52) U.S. Cl.
CPC ............... *H05K 1/09* (2013.01); *H05K 3/20* (2013.01); *H05K 3/384* (2013.01); *C25D 1/04* (2013.01); *C25D 3/38* (2013.01); *C25D 3/562* (2013.01); *C25D 3/58* (2013.01); *C25D 9/04* (2013.01); *H05K 2203/0307* (2013.01); *Y10T 428/12028* (2015.01)

(58) Field of Classification Search
USPC ......... 427/402; 205/109, 111, 152, 176, 191
See application file for complete search history.

(56) References Cited

U.S. PATENT DOCUMENTS

| | | | |
|---|---|---|---|
| 4,586,989 A | 5/1986 | Rasmussen | |
| 4,640,747 A | 2/1987 | Ueno et al. | |
| 4,915,981 A | 4/1990 | Traskos | |
| 5,019,222 A | 5/1991 | Hino et al. | |
| 5,316,803 A | 5/1994 | White, Jr. | |
| 5,366,814 A | 11/1994 | Yamanishi | |
| 5,370,784 A | 12/1994 | Kammel | |
| 5,458,746 A | 10/1995 | Burgess et al. | |
| 5,552,234 A | 9/1996 | Kawasumi | |
| 6,254,971 B1 | 7/2001 | Katayose | |
| 6,631,558 B2 | 10/2003 | Burgess | |
| 6,939,622 B2 | 9/2005 | Yoshihara et al. | |
| 6,969,557 B2 | 11/2005 | Matsuda | |
| 7,381,475 B2 | 6/2008 | Suzuki | |
| 7,651,783 B2 | 1/2010 | Tsuchida | |
| 8,142,905 B2 | 3/2012 | Moriyama et al. | |
| 8,449,987 B2 | 5/2013 | Kobayashi | |
| 8,524,378 B2 | 9/2013 | Arai et al. | |
| 9,060,431 B2 | 6/2015 | Arai | |
| 2002/0081443 A1 | 6/2002 | Connelly | |
| 2003/0093899 A1* | 5/2003 | Sakamoto | H05K 3/0038 29/846 |
| 2004/0170857 A1* | 9/2004 | Yoshihara | C25D 5/10 428/553 |
| 2004/0191560 A1* | 9/2004 | Matsuda | C25D 5/16 428/626 |
| 2004/0209109 A1* | 10/2004 | Tsuchida | C23C 28/00 428/626 |
| 2007/0160865 A1 | 7/2007 | Yoshihara | |
| 2009/0047539 A1 | 2/2009 | Dobashi et al. | |
| 2009/0208762 A1 | 8/2009 | Akase | |
| 2010/0068511 A1 | 3/2010 | Matsunaga et al. | |
| 2010/0212941 A1* | 8/2010 | Higuchi | C25D 3/56 174/257 |
| 2011/0262764 A1 | 10/2011 | Arai et al. | |
| 2012/0107637 A1 | 5/2012 | Akase | |
| 2012/0135266 A1 | 5/2012 | Kaminaga | |
| 2012/0148862 A1 | 6/2012 | Moriyama et al. | |
| 2012/0276412 A1 | 11/2012 | Miki | |
| 2013/0011734 A1 | 1/2013 | Arai et al. | |
| 2013/0220685 A1 | 8/2013 | Kohiki et al. | |
| 2014/0037976 A1 | 2/2014 | Arai et al. | |
| 2014/0057123 A1 | 2/2014 | Arai et al. | |
| 2014/0093743 A1 | 4/2014 | Arai et al. | |

FOREIGN PATENT DOCUMENTS

| | | | |
|---|---|---|---|
| JP | S58-028893 A | 2/1983 | |
| JP | H02-292894 | 12/1990 | |
| JP | H02-292895 A | 12/1990 | |
| JP | H04-096395 A | 3/1992 | |
| JP | H0987889 A | 3/1997 | |
| JP | H10-018075 | 1/1998 | |
| JP | H10-341066 A | 12/1998 | |
| JP | H11-135952 A | 5/1999 | |
| JP | H11-340595 A | 12/1999 | |
| JP | 2004-260068 A1 | 9/2004 | |
| JP | 2005-076124 A | 3/2005 | |
| JP | 2006-210689 A | 8/2006 | |
| JP | 2007-332418 A | 12/2007 | |
| JP | 2009-081396 A | 4/2009 | |
| KR | 2009-0084517 A | 8/2009 | |
| WO | WO-2009041292 A1 * | 4/2009 | ............ C25D 3/56 |
| WO | 2010/122918 A1 | 10/2010 | |

* cited by examiner

[Fig. 1]
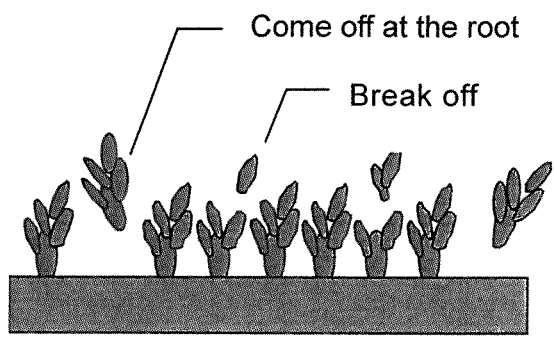
[Fig. 2]
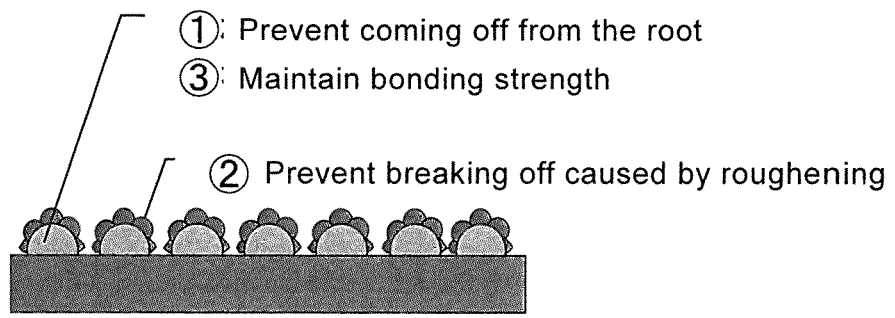

[Fig. 3]
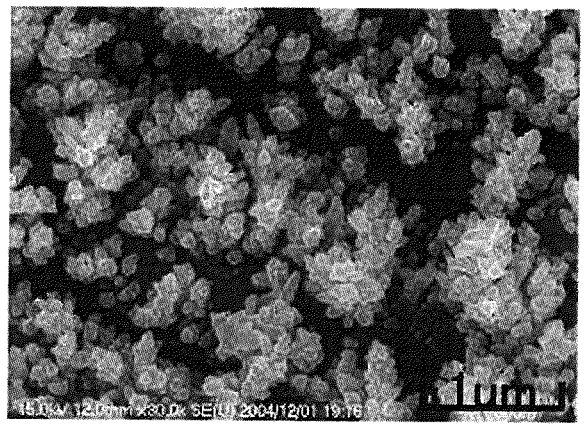
[Fig. 4]
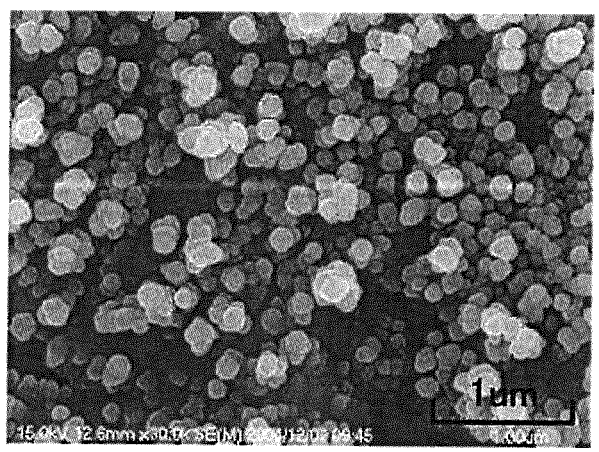

[Fig. 5]
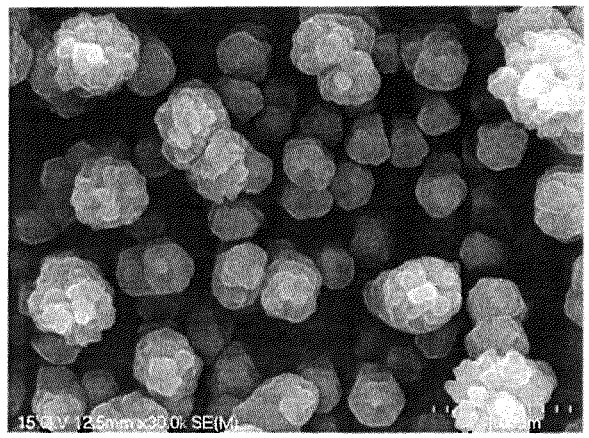
[Fig. 6]
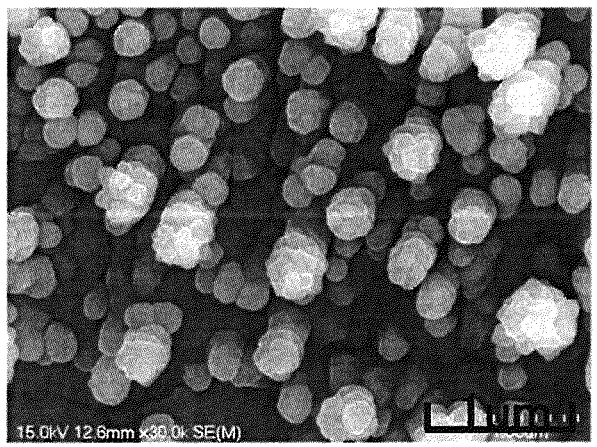

COPPER FOIL FOR PRINTED CIRCUIT

CROSS REFERENCE TO RELATED APPLICATIONS

This application is a continuation of co-pending U.S. application Ser. No. 13/635,147 filed Sep. 14, 2012, now U.S. Pat. No. 9,580,829, which is the National Stage of International Application No. PCT/JP2011/052276, filed Feb. 3, 2011, which claims the benefit under 35 USC 119 of Japanese Application No. 2010-107251, filed May 7, 2010.

BACKGROUND

The present invention relates to a copper foil for printed circuits, more specifically, the present invention relates to a copper foil for printed circuits, in which powder fall from the copper foil can be reduced and the peeling strength and heat resistance can be improved, prepared by forming a primary particle layer of copper on a surface of a copper foil, and then forming a secondary particle layer based on copper-cobalt-nickel alloy plating thereon. The copper foil for printed circuits of the present invention is particularly suitable for, for example, a fine-pattern printed circuit and a FPC (Flexible Printed Circuit) for magnetic heads.

Copper and copper alloy foils (hereinafter referred to as "copper foil") have contributed significantly to the advances in the electric- and electronic-related industries and become essential, in particular, as materials for printed circuits. In general, a copper clad laminate is prepared by adhesively laminating a copper foil for printed circuits onto a substrate such as a synthetic resin board or film under high temperature and high pressure with or without using an adhesive. Then a necessary circuit is printed via the steps of resist application and exposure, followed by etching treatment for eliminating unwanted portions to form an intended circuit. Finally, desired elements are soldered to form various types of printed circuit boards for electronics devices. Although a treating method of a copper foil for printed circuit boards is different between a surface (roughened surface) to be bonded to the resin base material, and a non-bonding surface (glossy surface), a number of methods have been proposed for respective surfaces.

For example, main requirements for the roughened surface formed on a copper foil include: (1) no oxidative discoloration during storage; (2) sufficient peel strength against a substrate even after high-temperature heating, wet processing, soldering, chemical treatment and the like; and (3) no so-called lamination stains, which may occur after the lamination onto a substrate and etching treatment. Roughening treatment of copper foil has an important role in determining the adhesiveness between the copper foil and the substrate. For this roughening treatment, copper roughening treatment in which copper is electrodeposited was initially employed, but then various other technologies have been proposed. Now, copper-nickel roughening treatment has become established as one of the representative treatment methods in order to improve thermal peeling strength, hydrochloric-acid resistance and oxidation resistance. The present applicant has proposed copper-nickel roughening treatment (see Japanese Laid-Open Patent Publication No. S52-145769 A), and produced successful results. A copper-nickel treated surface takes on a black color, and this black color of the copper-nickel treated surface is now acknowledged as a product symbol of, in particular, rolled foil for flexible substrates.

The copper-nickel roughening treatment is superior in terms of thermal peeling strength, oxidation resistance and hydrochloric acid resistance; but etching with an alkali etching solution, which has become increasingly important for fine pattern treatment in recent years, becomes difficult, etch residues remain on the treated layer during the formation of fine patterns having 150 µm pitch or less. Accordingly, for fine pattern treatment, the present applicant previously developed Cu—Co treatment (see Japanese Patent Publication No. S63-2158 and Japanese Patent Application No. H01-112227 A) and Cu—Co—Ni treatment (see Japanese Patent Application No. H01-112226 A). These roughening treatments showed better etching properties, alkali etching properties and hydrochloric-acid resistance, but it was found that thermal peeling strength was decreased when an acrylic adhesive was used, and oxidation resistance was not sufficient as desired, and the color tone did not become black but was brown to dark brown.

Pursuant to the trend of finer patterns and diversification of printed circuits in recent years, the followings are further required: 1) thermal peeling strength (particularly when an acrylic adhesive is used) and hydrochloric-acid resistance should be comparable to those for the case of the Cu—Ni treatment; 2) etching with an alkali etching solution should be possible to produce a printed circuit having a pattern of 150 µm pitch or less; 3) oxidation resistance should be improved (being resistant to oxidation in an oven at 180° C. for 30 minutes) as in the case of the Cu—Ni treatment; and 4) the treatment should produce a black surface as in the case of the Cu—Ni treatment.

In other words, when the circuit becomes finer, the circuit tends to more easily peel off due to a hydrochloric acid etching solution, so that such peeling off needs to be prevented. When the circuit becomes finer, the circuit also tends to more easily peel off due to the high temperature at a process such as soldering, so that such peeling off also needs to be prevented. At the present time when circuits are increasingly becoming finer, etching a printed circuit having a pattern of 150 µm pitch or less with the use of, for example, a $CuCl_2$ etching solution is already an essential requirement, and alkali etching is also becoming a necessary requirement because resists and the like are increasingly varied. A black surface is also becoming more important from the viewpoint of manufacturing copper foil and chip mounting in order to improve positioning precision and heat absorption.

In response to such demands, the present applicant successfully developed a method of treating a copper foil, wherein a cobalt plated layer or a cobalt-nickel alloy plated layer is formed on the copper foil surface after being subject to copper roughening treatment via a copper-cobalt-nickel alloy plating, so that: the copper foil possesses many of the above general properties as the copper foil for printed circuits and particularly possesses the properties described above which are comparable to those in the Cu—Ni treatment; thermal peeling strength is not reduced when using an acrylic adhesive; the copper foil has superior oxidation resistance; and the copper foil surface takes on a blackened color (see Japanese Patent Publication No. H06-54831). Preferably, after forming the cobalt plated layer or the cobalt-nickel alloy plated layer, rustproof treatment is applied, represented by coating treatment with chrome oxide alone or coating treatment with the mixture of chrome oxide and zinc and/or zinc oxide.

Subsequently, as the development of electronic equipment advances, semiconductor devices increasingly become smaller and more highly integrated. Even higher temperature is required for treatments in the manufacturing process of these printed circuits, and heat is generated when using a product in which such semiconductor devices are incorporated. As a result, the decrease in bonding strength between a copper foil and a resin substrate is again recognized as a problem. In light of the above, the present applicant inventively improved thermal peeling resistance in the method for treating copper foil for printed circuits according to Japanese Patent Publication No. 2849059, in which a roughening treatment is performed to a surface of a copper foil by way of copper-cobalt-nickel alloy plating, and a cobalt plated layer or a cobalt-nickel alloy plated layer is thereafter formed.

This method for treating copper foil for printed circuits is a method in which a cobalt-nickel alloy plated layer is formed after performing a roughening treatment to a surface of a copper foil via copper-cobalt-nickel alloy plating, and then a zinc-nickel alloy plated layer is further formed. It is an extremely effective invention, and materials produced according to the invention are now one of the major products of copper-foil circuit materials. For producing a copper-foil circuit that is even more thin-lined, the process of soft etching the upper surface of a copper circuit using an etching solution containing sulfuric acid and hydrogen peroxide is performed after a circuit is once formed on a substrate. During this process, a problem occurred that the etching solution infiltrated into the edge portion of the bonded interface between the copper foil and a resin substrate such as polyimide. This may be considered as a partial corrosion of the treated surface of the copper foil. Such corrosion is a significant problem since it reduces the bonding strength between the copper foil and the resin in a fine circuit. Solving this problem is also demanded.

In the treatment of copper foil for printed circuits, in which a cobalt-nickel alloy plated layer is formed after performing a roughening treatment to a surface of a copper foil via copper-cobalt-nickel alloy plating, and then a zinc-nickel alloy plated layer is further formed; the present inventors, after numerous attempts, successfully provided several major improvements in the properties of the copper foil for printed circuits. The early technologies of the roughening treatment by copper-cobalt-nickel alloy plating are disclosed in Japanese Laid-Open Patent Publication No. H04-96395 and Japanese Laid-Open Patent Publication No. H10-018075 A.

However, since the structure of the roughening particles formed on the surface of copper foil via copper-cobalt-nickel alloy plating as the most basic roughening treatment is dendritic, there was a problem that the particles came off from the upper or base parts of the dendritic structure, causing a phenomenon generally known as powder fall. This powder fall is a problematic phenomenon. Although a roughened layer treated by copper-cobalt-nickel alloy plating can be characterized by having superior adherence with a resin layer and superior heat resistance, the particles therein may easily come off by external force as mentioned above, causing flaking due to "rubbing", adhesion of flakes onto the roll, and occurrence of etch residues due to the flakes during the process.

Provided that blackening treatment by copper-cobalt-nickel alloy plating (in Example 1, Cu: 3.3 mg/dm$^2$, Co: 6.3 mg/dm$^2$, Ni: 1.6 mg/dm$^2$) is performed, techniques are disclosed in which copper foil is plated with fine copper particles in advance in order to make the color tone darker in the blackening treatment and to prevent the phenomenon of powder fall, and in which a smooth layer of cobalt or cobalt-nickel is provided as the outermost layer to prevent powder fall (Japanese Laid-Open Patent Publication No. 2004-260068 A). In this case, providing a smooth layer of cobalt or cobalt-nickel as the outermost layer is the main requirement for preventing powder fall. Rather, powder fall from copper-cobalt-nickel alloy plating will depend on the structure of particles in a primary layer of copper applied to copper foil, and the composition and the particle structure of a cobalt layer or a cobalt-nickel layer formed as a secondary particle layer thereon. However, Japanese Laid-Open Patent Publication No. 2004-260068 only provides formation of a smooth layer as the outermost layer, hardly providing a fundamental solution for powder fall.

SUMMARY

The object of the present invention is to provide copper foil for printed circuits, which can: inhibit uneven treatment, and a phenomenon commonly called as powder fall where roughening particles formed in a dendritic structure via copper-cobalt-nickel alloy plating as the most basic roughening treatment come off from the surface of the copper foil; increase its peeling strength; and improve its heat resistance. As the development of electronic equipment advances, semiconductor devices increasingly become smaller and more highly integrated, and as a result, requirements for the treatments in manufacturing these printed circuits are even more demanding. An object of the present invention is to provide a technology which satisfies these demands.

The present invention provides the following inventions. 1) A copper foil for printed circuits prepared by forming a roughening primary particle layer of copper on a surface of a copper foil, and then forming a roughening secondary particle layer based on ternary alloy composed of copper, cobalt and nickel on the roughening primary particle layer; wherein the average particle size of the roughening primary particle layer is 0.25 to 0.45 µm, and the average particle size of the roughening secondary particle layer based on ternary alloy composed of copper, cobalt and nickel is 0.05 to 0.25 µm. 2) The copper foil for printed circuits according to 1) above, wherein the roughening primary particle layer and the roughening secondary particle layer are electrodeposited layers. 3) The copper foil for printed circuits according to 1) or 2) above, wherein the secondary particle is one or more dendritic particles grown on a primary particle. 4) The copper foil for printed circuits according to any one of 1) to 3) above, wherein a bonding strength of the roughening primary particle layer and the roughening secondary particle layer is 0.80 kg/cm or more. 5) The copper foil for printed circuits according to any one of 1) to 3) above, wherein the bonding strength of the roughening primary particle layer and the roughening secondary particle layer is 0.90 kg/cm or more. 6) The copper foil for printed circuits according to any one of 1) to 5) above, wherein a roughness, Rz, of a surface formed by the roughening primary particle layer and the roughening secondary particle layer is 1.5 µm or less. 7) The copper foil for printed circuits according to any one of 1) to 5) above, wherein a roughness, Rz, of a surface formed by the roughening primary particle layer and the roughening secondary particle layer is 1.0 µm or less.

The present invention can provide copper foil for printed circuits, prepared by forming a cobalt-nickel alloy plated layer on the roughening secondary particle layer based on copper-cobalt-nickel alloy plating, and further forming a zinc-nickel alloy plated layer on the cobalt-nickel alloy plated layer. The deposited amount of cobalt in the cobalt-nickel alloy plated layer may be set to 200 to 3000 µg/dm$^2$, and the ratio of cobalt may be set to 60 to 66 mass %. The zinc-nickel alloy plated layer can be formed in which the total amount is set in the range of 150 to 500 µg/dm², the amount of nickel is set in the range of 50 µg/dm² or more, and the nickel ratio is set in the range of 0.16 to 0.40.

A rustproof treatment layer may also be formed on the zinc-nickel alloy plated layer. With regard to this rustproof treatment, for example, a coating layer of chrome oxide alone, or a coating layer of the mixture of chrome oxide and zinc and/or zinc oxide may be formed. Furthermore, a silane coupling layer may be formed on the mixed layer. The copper foil for printed circuits described above may be used to manufacture a copper-clad laminate in which the copper foil adheres on a resin substrate through thermocompression bonding without being mediated by an adhesive.

The present invention provides copper foil for printed circuits, which can: inhibit a phenomenon commonly called as powder fall where roughening particles formed in a dendritic structure via copper-cobalt-nickel alloy plating as the most basic roughening treatment come off from the surface of the copper foil (the formation of a roughening secondary particle layer); increase its peeling strength; and improve its heat resistance. Moreover, since an amount of abnormally grown particles will be decreased, its particle size will be uniform, and its whole surface will be covered; its etching properties will be improved, and formation of a high-precision circuit becomes possible. As the development of electronic equipment advances, semiconductor devices increasingly become smaller and more highly integrated, and as a result, requirements for the treatments in manufacturing these printed circuits are even more demanding. The present invention can provide technical effects to satisfy these demands.

BRIEF DESCRIPTION OF THE DRAWINGS

FIG. 1 is a schematic view showing the state of powder fall when roughening treatment based on copper-cobalt-nickel alloy plating was applied on a conventional copper foil.

FIG. 2 is a schematic view of a treated layer of the copper foil with no powder fall according to the present invention, prepared by forming a roughening primary particle layer on the copper foil, and then forming a roughening secondary particle layer based on copper-cobalt-nickel alloy plating on the roughening primary particle layer.

FIG. 3 is a micrograph of the surface of the conventional copper foil on which roughening treatment based on copper-cobalt-nickel alloy plating was applied.

FIG. 4 is a micrograph of the surface of the copper foil on which roughening treatment based on copper-cobalt-nickel alloy plating was applied with a reduced current density and a decreased processing rate.

FIG. 5 is a micrograph of the treated layer of a copper foil with no powder fall according to the present invention, which was prepared by forming a roughening primary particle layer on the copper foil, and then forming a roughening secondary particle layer based on copper-cobalt-nickel alloy plating on the roughening primary particle layer.

FIG. 6 is a micrograph of the treated layer of a copper foil with no powder fall according to the present invention, which was prepared by forming a roughening primary particle layer on the copper foil, and then forming a roughening secondary particle layer based on copper-cobalt-nickel alloy plating on the roughening primary particle layer, and obtained by further improving the roughness.

DETAILED DESCRIPTION

Copper foil used in the present invention may be either electrolytic copper foil or rolled copper foil. In order to improve the peeling strength of the copper foil after lamination, the surface of the copper foil to be bonded to the resin base material, namely the roughened surface of the copper foil, is normally subject to roughening treatment in which electrodeposition is performed onto the surface of a degreased copper foil to obtain a knobbed copper surface. Electrolytic copper foil shows irregularity at the time of manufacturing, but the convex portions are reinforced by the roughening treatment to further emphasize the irregularity. Rolled copper foil and electrolytic copper foil may be treated somewhat differently. As used in the present invention, "roughening treatment" includes such pretreatment and finishing treatments, and if desired, any known treatment related to copper-foil roughening.

This roughening treatment is to be performed herein using copper-cobalt-nickel alloy plating (in the following description, the roughening treatment based on copper-cobalt-nickel alloy plating is called "a roughening secondary particle layer" to clearly distinguish it from the above processes), but powder fall and the like would occur by simply forming a copper-cobalt-nickel alloy plated layer on the copper foil as described above.

FIG. 3 shows a micrograph of the surface of the copper foil on which a copper-cobalt-nickel alloy plated layer is formed. As shown in FIG. 3, fine particles grown in a dendritic structure are seen. Generally, the fine particles grown in a dendritic structure shown in FIG. 3 are produced under high current density. When treated under such high current density, particle nucleation is inhibited at the initial electrodeposition, causing new particle nucleation to be formed at the tips of the particles. As a result, thin and long particles will be gradually grown in a dendritic structure. Therefore when electroplating is performed under lower current density to prevent this, as shown in FIG. 4, there are less sharp projections, and more particles and roundly shaped particles are grown. Powder fall will be improved to a smaller extent under the condition shown in FIG. 4, which is, however, not enough to achieve the object of the present invention.

Powder fall is illustrated in FIG. 1 in the case that a copper-cobalt-nickel alloy plated layer is formed as shown in FIG. 3. This powder fall occurs because fine dendritic particles are formed on copper foil as described above. These dendritic particles are easily broken at their branches or come off at their root by external force. These fine dendritic particles may cause flaking due to "rubbing", grime on the roll due to the flakes, and etch residues due to the flakes during the process.

In the present invention, a roughening secondary particle layer based on ternary alloy composed of copper, cobalt and nickel is to be formed on a roughening primary particle layer which is formed on a surface of copper foil. Micrographs of the surface of copper foil on which these primary particles and secondary particles are formed are shown in FIG. 5 and FIG. 6 (see below for details). The obtained thereby is a copper foil for printed circuits, wherein a phenomenon commonly called as "powder fall" and uneven treatment; namely, flaking due to "rubbing" during the process, grime on the roll due to the flakes, and etch residues due to the flakes; can be inhibited, its peeling strength can be increased, and its heat resistance can be improved.

As clearly shown in Examples below, optimal conditions to prevent powder fall are the average particle size of 0.25 to 0.45 µm for the roughening primary particle layer, and the average particle size of 0.05 to 0.25 µm for the roughening secondary particle layer based on ternary alloy composed of copper, cobalt and nickel. The roughening primary particle layer and the roughening secondary particle layer described above are formed by electroplating. This secondary particle is characterized by being one or more dendritic particles grown on a primary particle. As described above, the average particle size for the roughening secondary particle layer, which is set to as small as 0.05 to 0.25 μm, can also be restated as the height of the particles. That is, one of the features of the present invention can be considered as inhibiting the height of the secondary particle so that peel-off (powder fall) of the particles is inhibited.

The bonding strength of 0.80 kg/cm or more, even 0.90 kg/cm or more, can be achieved for the roughening primary particle layer and the roughening secondary particle layer formed as described above. Moreover, with regard to the roughness of the surface formed by the roughening primary particle layer and the roughening secondary particle layer, Rz of 1.5 μm or less, even 1.0 μm or less, can be achieved. Lowering surface roughness inhibits a phenomenon of powder fall more effectively. The present invention can provide a copper foil for printed circuits having the properties and characteristics as described above.

Plating Conditions for the Primary Particles of Copper

One example of plating conditions for the primary particles of copper is as follows. Note that the plating conditions shown below are merely an example of suitable conditions and the average particle size of the primary copper particles formed on the copper foil has a role in preventing powder fall. Therefore, as long as the average particle size falls into the range of the present invention, plating conditions are in no way limited to the conditions shown below. The present invention will encompass those. Moreover, a metal plated layer may be provided between the copper foil and the primary particles before the primary particles are formed. Representative metal plated layers include a copper plated layer and a copper alloy plated layer. For providing a copper plated layer, the methods of forming the copper plated layer include electroplating where only an aqueous solution of copper sulfate containing copper sulfate and sulfuric acid as main components is used, and electroplating where an aqueous solution of copper sulfate combined with sulfuric acid, an organosulfur compound having a mercapto group, a surface active agent such as polyethylene glycol, and also a chloride is used.
Solution composition: 10 to 20 g/L of copper, 50 to 100 g/L of sulfuric acid
Solution temperature: 25 to 50° C.
Current density: 1 to 58 A/dm$^2$
Coulomb: 4 to 81 As/dm$^2$ Plating Conditions for the Secondary Particles Note that, as described above, the plating conditions shown below are merely an example of suitable conditions, the secondary particles is to be formed on the primary particles, and the average particle size has a role in preventing powder fall. Therefore, as long as the average particle size falls into the range of the present invention, plating conditions are in no way limited to the conditions shown below. The present invention will encompass those.
Solution composition: 10 to 20 g/L of copper, 5 to 15 g/L of nickel, 5 to 15 g/L of cobalt
pH: 2 to 3
Solution temperature: 35 to 50° C.
Current density: 24 to 50 A/dm$^2$
Coulomb: 34 to 48 As/dm$^2$ Plating Conditions to Form Heatproof Layer 1

The present invention can further provide a heatproof layer to be formed on the roughening secondary particle layer described above. The plating conditions for this are shown below.
Solution composition: 5 to 20 g/L of nickel, 1 to 8 g/L of cobalt
pH: 2 to 3
Solution temperature: 40 to 60° C.
Current density: 5 to 20 A/dm$^2$
Coulomb: 10 to 20 As/dm$^2$ Plating Conditions to Form Heatproof Layer 2

The present invention can further provide an additional heatproof layer to be formed on the roughening secondary particle layer. The plating conditions for this are shown below.
Solution composition: 2 to 30 g/L of nickel, 2 to 30 g/L of zinc
pH: 3 to 4
Solution temperature: 30 to 50° C.
Current density: 1 to 2 A/dm$^2$
Coulomb: 1 to 2 As/dm$^2$ Plating Conditions to Form a Rustproof Layer The present invention can further provide an additional rustproof layer. The plating conditions for this are shown below. Conditions for immersion chromate treatment are shown below, but electrolytic chromate treatment may also be used.
Solution composition: 1 to 10 g/L of potassium dichromate, 0 to 5 g/L of zinc
pH: 3 to 4
Solution temperature: 50 to 60° C.
Current density: 0 to 2 A/dm$^2$ (for immersion chromate treatment)
Coulomb: 0 to 2 As/dm$^2$ (for immersion chromate treatment)

Types of a Weatherproof Layer

An example may be application of an aqueous epoxy silane solution.

With regard to the copper-cobalt-nickel alloy plating as the secondary particles described above, a ternary alloy layer where 10 to 30 mg/dm$^2$ of copper, 100 to 3000 μg/dm$^2$ of cobalt, 50 to 500 μg/dm$^2$ of nickel are deposited may be formed by electrolytic plating. The heat resistance and etching properties would deteriorate when the deposited amount of Co is less than 100 μg/dm$^2$. The deposited amount of Co exceeding 3000 μg/dm$^2$ would not be preferred when magnetic effects need to be taken into account, and would cause etching stains and possibly deterioration of acid resistance and chemical resistance.

The heat resistance would deteriorate when the deposited amount of Ni is less than 50 μg/dm$^2$. On the other hand, the etching properties would deteriorate when the deposited amount of Ni exceeds 500 μg/dm$^2$. That is, etch residues remain, and etching can be managed but fine patterning will be difficult. The preferred deposited amount of Co is 500 to 2000 μg/dm$^2$, and the preferred deposited amount of nickel is 50 to 300 μg/dm$^2$. Accordingly, the preferred deposited amount of copper-cobalt-nickel alloy plating can be 10 to 30 mg/dm² of copper, 100 to 3000 μg/dm² of cobalt, and 50 to 500 μg/dm² of nickel. The above deposited amount of each component in the ternary alloy layer is a merely preferred condition, and their ranges are in no way limited to those indicated above.

As used herein, etching stains mean that Co remains undissolved when etched with copper chloride, and etch residues mean that Ni remains undissolved when alkaline-etched with ammonium chloride. In general, in order to form a circuit, an alkaline etching solution and a copper chloride-based etching solution are used as described in the following Examples. Although these etching solutions and etching conditions have broad utility, it is to be understood that conditions are not limited to these conditions and any other conditions can be selected.

According to the present invention, a cobalt-nickel alloy plated layer can be formed on a roughened surface on which secondary particles were formed (after being subject to roughening treatment) as described above. For this cobalt-nickel alloy plated layer, the deposited amount of cobalt is preferably 200 to 3000 μg/dm², and the ratio of cobalt is preferably set to be 60 to 66 mass %. In a broad sense, this treatment can be considered as a type of rustproof treatment. This cobalt-nickel alloy plated layer should be provided to an extent that the bonding strength between the copper foil and the substrate is not substantially reduced. The deposited amount of cobalt of less than 200 μg/dm² would not be preferred because it would result in decreased thermal peeling strength and deteriorated oxidation resistance and chemical resistance as well as a reddish treated surface. In addition, the deposited amount of cobalt exceeding 3000 μg/dm² would not be preferred when magnetic effects need to be taken into account, and would cause etching stains and possibly deterioration of acid resistance and chemical resistance. The preferred deposited amount of cobalt is 400 to 2500 μg/dm².

Moreover, an excess amount of deposited cobalt might cause infiltration during soft etching. From this, the preferred ratio of cobalt can be 60 to 66 mass %. As described below, infiltration during soft etching is directly and mainly caused by a heatproof and rustproof layer comprising a zinc-nickel alloy plated layer. Nonetheless, adjusting the amount of cobalt as indicated above is preferred because cobalt may also cause infiltration during soft etching. On the other hand, an insufficient amount of deposited nickel would decrease thermal peeling strength, oxidation resistance, and chemical resistance. Moreover, an excess amount of deposited nickel would deteriorate alkali etching properties. Therefore it is preferable to determine in balance with the cobalt content.

The present invention can further provide a zinc-nickel alloy plated layer to be formed on a cobalt-nickel alloy plating. The total amount of the zinc-nickel alloy plated layer is set to 150 to 500 μg/dm², and the ratio of nickel is set to 16 to 40 mass %. It serves as a heatproof and rustproof layer. This is also merely a preferred condition, and other known zinc-nickel alloy platings can be used. It will be understood that this zinc-nickel alloy plating is a preferred complementary condition in the present invention. Even higher temperature is required in the manufacturing process of printed circuits, and heat is generated when using a product in which printed circuits are incorporated. For example, in the case of a so-called double-layer material where a copper foil and a resin are bonded by thermocompression, they are exposed to heat at a temperature of 300° C. or higher upon being bonded. Even under such conditions, it is necessary to prevent a decrease in the bonding strength between the copper foil and the resin substrate, and this zinc-nickel alloy plating is effective.

With the conventional art, in a fine circuit comprising a zinc-nickel alloy plated layer in a double-layer material where a copper foil and a resin are bonded by thermocompression, discoloration due to infiltration occurs at the edge portion of the circuit during soft etching. Nickel has an effect to inhibit infiltration of an etching agent (an aqueous etching solution of $H_2SO_4$: 10 wt % and $H_2O_2$: 2 wt %) used during soft etching. As described above, by setting the total amount of a zinc-nickel alloy plated layer to 150 to 500 μg/dm², the nickel ratio in the alloy layer to 16 mass % at the lower limit and 40 mass % at the upper limit, and the nickel content to 50 μg/dm² or more; the zinc-nickel alloy plated layer comes to be able to serve as a heatproof and rustproof layer, and exert effects to inhibit infiltration of an etching agent used during soft etching and prevent a reduction in the bonding strength of a circuit due to corrosion.

When the total amount of the zinc-nickel alloy plated layer is less than 150 μg/dm², the ability of heat resistance and rust-proofing is decreased, and it becomes difficult to serve as a heatproof and rustproof layer. When the amount exceeds 500 μg/dm², resistance to hydrochloric acid tends to be deteriorated. Moreover, when the nickel ratio in the alloy layer is less than 16 mass % at the lower limit, the amount of infiltration during soft etching exceeds 9 μm, and it is not preferred. Technically, the upper limit of 40 mass % for the nickel ratio is a limit value to allow formation of a zinc-nickel alloy plated layer.

As described above, the present invention can provide, if needed, a cobalt-nickel alloy plated layer and further a zinc-nickel alloy plated layer in sequence to be formed on a copper-cobalt-nickel alloy plated layer as a roughening secondary particle layer. The total deposited amount of cobalt and nickel in these layers may be adjusted. The total deposited amount of cobalt is preferably set to 300 to 4000 μg/dm², and the total deposited amount of nickel is preferably set to 150 to 1500 μg/dm². When the total deposited amount of cobalt is less than 300 μg/dm², heat resistance and chemical resistance would deteriorate. The total deposited amount of cobalt exceeding 4000 μg/dm² might cause etching stains. Moreover, when the total deposited amount of nickel is less than 150 μg/dm², heat resistance and chemical resistance would deteriorate. The total deposited amount of nickel exceeding 1500 μg/dm² would cause etch residues. Preferably, the total deposited amount of cobalt is 1500 to 3500 μg/dm², and the total deposited amount of nickel is 500 to 1000 gig/dm². As long as the above conditions are satisfied, they are not limited to the particular conditions described in this paragraph.

Then rustproof treatment is performed if desired. Preferred rustproof treatment for the present invention is coating treatment with chrome oxide alone or coating treatment with the mixture of chrome oxide and zinc/zinc oxide. The coating treatment with the mixture of chrome oxide and zinc/zinc oxide is a treatment to form a rustproof layer based on the zinc-chromium group mixture consisting of zinc or zinc oxide and chrome oxide by electroplating using a plating bath containing zinc salt or zinc oxide and chromate. As the plating bath, representatively used is a mixed aqueous solution of at least one from bichromate such as $K_2Cr_2O_7$ and $Na_2Cr_2O_7$, $CrO_3$, and the like; at least one from water-soluble zinc salt such as $ZnO$ and $ZnSO_4 \cdot 7H_2O$; and alkali hydroxide. Examples of representative plating bath compositions and electrolytic conditions are as follows.

Copper foil obtained in this manner will have superior thermal peeling strength, oxidation resistance and hydrochloric acid resistance. Moreover, a $CuCl_2$ etching solution can be used to perform etching to the printed circuits with a pattern of 150 μm pitch or less, and even alkali etching can be performed. Moreover, infiltration into the edge portion of a circuit during soft etching can be inhibited. For a soft etching solution, an aqueous solution of $H_2SO_4$: 10 wt % and $H_2O_2$: 2 wt % can be used. Processing time and temperature can be adjusted appropriately. As the alkali etching solution, for instance, a solution (temperature 50° C.) consisting of $NH_4OH$ solution with 6 mol/liter, $NH_4Cl$ solution with 5 mol/liter, and $CuCl_2$ solution with 2 mol/liter is known.

Copper foils obtained from all the above processes show a black color as in the case of the Cu—Ni treatment. A black color is significant in terms of higher positioning precision and heat absorptivity. For example, printed circuit boards including rigid and flexible boards are mounted with components such as IC, a resistor and a capacitor in an automated process. In the process, chip mounting is performed while reading a circuit by a sensor. At this time, positioning on the copper foil treated surface may be performed through a film such as Kapton. Positioning when making a through hole is similarly performed. The blacker the treated surface is, the better the light is absorbed, and therefore positioning will be more precise. Furthermore, when manufacturing a board, bonding is often performed while applying heat to the copper foil and the film for curing. If heat is applied using long-wavelength radiation such as far-infrared and infrared radiation at this time, heating efficiency is better when a treated surface takes on a blackened color.

Finally, if desired, for the primary purpose of improving the bonding strength between the copper foil and the resin substrate, silane treatment is performed where a silane coupling agent is applied onto at least a roughened surface on the rustproof layer. Silane coupling agents used for this silane treatment include olefin-based silane, epoxy-based silane, acrylic silane, amino silane and mercapto-based silane. Any agent appropriately selected among them may be used. A method for applying a silane coupling agent solution may be either spray by a sprayer, application by a coater, immersion, or flow coating. For example, Japanese Patent Publication No. S60-15654 describes the improvement in the adhesive strength between a copper foil and a resin substrate by performing silane coupling treatment after applying chromate treatment onto a roughened side of the copper foil. See the reference for details. Then, if desired, annealing treatment may be performed in order to improve the ductility of copper foil.

EXAMPLES

Now reference is made to Examples and Comparative Examples. Please note that these Examples are merely for illustrative purpose, and the present invention is not limited thereby. That is, other aspects or modifications included in the present invention are encompassed.

Examples 1 to 9

A roughening primary particle layer (Cu) and a roughening secondary particle layer (copper-cobalt-nickel alloy plating) were formed on rolled copper foil under the conditions and ranges shown below. Bath compositions and the plating conditions used herein are as follows.

Bath Compositions and Plating Conditions (A) Formation of a Roughening Primary Particle Layer (Cu Plating)
Solution composition: 15 g/L of copper, 75 g/L of sulfuric acid
Solution temperature: 35° C.
Current density: 2 to 58 $A/dm^2$
Coulomb: 8 to 81 $As/dm^2$
(B) Formation of a Roughening Secondary Particle Layer (Cu—Co—Ni Alloy Plating)
Solution composition: 15 g/L of copper, 8 g/L of nickel, 8 g/L of cobalt
pH: 2
Solution temperature: 40° C.
Current density: 24 to 31 $A/dm^2$
Coulomb: 34 to 44 $As/dm^2$ Comparative Examples 1 to 9

In Comparative Examples, the bath compositions and the plating conditions used herein are as follows.

Bath Compositions and Plating Conditions (A) Formation of a Roughening Primary Particle Layer (Copper Plating)
Solution composition: 15 g/L of copper, 75 g/L of sulfuric acid
Solution temperature: 35° C.
Current density: 1 to 58 $A/dm^2$
Coulomb: 4 to 81 $As/dm^2$
(B) Formation of a Roughening Secondary Particle Layer (Cu—Co—Ni Alloy Plating Conditions)
Solution composition: 15 g/L of copper, 8 g/L of nickel, 8 g/L of cobalt
pH: 2
Solution temperature: 40° C.
Current density: 24 to 50 $A/dm^2$
Coulomb: 34 to 48 $As/dm^2$ For the roughening primary particle layer (Cu plating) and the roughening secondary particle layer (Cu—Co—Ni alloy plating) on the copper foil formed according to the above Examples, the average particle size of the primary particles, the average particle size of the secondary particles, powder fall, peeling strength, heat resistance and roughness (Rz) are shown in Table 1. The corresponding results from Comparative Examples are also shown in Table 1.

TABLE 1

| | Particle Size of Primary Particles (μm) | Height of Secondary Particles (μm) | Dust Fall | Peeling Strength (kg/cm) | Heat Resistance (kg/cm) | Roughness Rz (μm) |
|---|---|---|---|---|---|---|
| Comparative Example 1 | 0.15 | 0.05 | Good | 0.75 | 0.70 | 0.87 |
| Comparative Example 2 | 0.15 | 0.15 | Good | 0.75 | 0.70 | 0.88 |
| Comparative Example 3 | 1.5 | 0.25 | Fair | 0.83 | 0.72 | 0.90 |
| Comparative Example 4 | 0.15 | 0.35 | Bad | 0.85 | 0.72 | 0.91 |
| Example 1 | 0.25 | 0.05 | Good | 0.88 | 0.71 | 0.98 |
| Example 2 | 0.25 | 0.15 | Good | 0.90 | 0.72 | 0.98 |
| Example 3 | 0.25 | 0.25 | Fair | 0.92 | 0.73 | 1.02 |

TABLE 1-continued

| | Particle Size of Primary Particles (μm) | Height of Secondary Particles (μm) | Dust Fall | Peeling Strength (kg/cm) | Heat Resistance (kg/cm) | Roughness Rz (μm) |
|---|---|---|---|---|---|---|
| Comparative Example 5 | 0.25 | 0.35 | Bad | 0.93 | 0.72 | 1.15 |
| Example 4 | 0.35 | 0.05 | Good | 0.95 | 0.73 | 1.20 |
| Example 5 | 0.35 | 0.15 | Good | 0.96 | 0.74 | 1.20 |
| Example 6 | 0.35 | 0.25 | Fair | 0.98 | 0.75 | 1.51 |
| Comparative Example 6 | 0.35 | 0.35 | Bad | 0.98 | 0.73 | 1.50 |
| Example 7 | 0.45 | 0.05 | Good | 0.96 | 0.71 | 1.21 |
| Example 8 | 0.45 | 0.15 | Good | 0.97 | 0.72 | 1.54 |
| Example 9 | 0.45 | 0.25 | Fair | 0.98 | 0.74 | 1.60 |
| Comparative Example 7 | 0.45 | 0.35 | Bad | 0.98 | 0.77 | 1.55 |
| Comparative Example 8 | 0.25 | 0 | Good | 0.94 | 0.54 | 1.10 |
| Comparative Example 9 | 0 | 0.60 | Bad | 0.90 | 0.73 | 0.78 |

As clearly shown in Table 1, the results from Examples according to the present invention are as follows. In Example 1, the current density was set to 51 A/dm$^2$ and 2 A/dm$^2$, and the coulomb was set to 72 As/dm$^2$ and 8 As/dm$^2$ to form primary particles, while the current density was set to 24 A/dm$^2$, and the coulomb was set to 34 As/dm$^2$ to form secondary particles. Note that the current density and the coulomb to form primary particles are in two steps because formation of primary particles usually requires two-step electroplating: i.e., a first step in which particle nucleation occurs, and a second step in which nuclear particles are grown by electroplating. The former is an electroplating condition for the particle nucleation in the first step, and the latter is an electroplating condition for growth of the nuclear particles in the second step. We will not mention this for each of the following Examples and Comparative Examples, because it applies to all. The results showed that the average particle size of the primary particles and that of the secondary particles were 0.25 μm and 0.05 μm respectively, no powder fall was observed, the peeling strength under ordinary state was as high as 0.88 kg/cm, the heat resistance (peeling strength after heating at 180° C. for 48 hours) was as high as 0.71 kg/cm, and the surface roughness Rz was 0.98 μm.

In Example 2, the current density was set to 51 A/dm$^2$ and 2 A/dm$^2$, and the coulomb was set to 72 As/dm$^2$ and 8 As/dm$^2$ to form primary particles, while the current density was set to 28 A/dm$^2$, and the coulomb was set to 39 As/dm$^2$ to form secondary particles. The results showed that the average particle size of the primary particles and that of the secondary particles were 0.25 μm and 0.15 μm respectively, no powder fall was observed, the peeling strength under ordinary state was as high as 0.90 kg/cm, the heat resistance (peeling strength after heating at 180° C. for 48 hours) was as high as 0.72 kg/cm, and the surface roughness Rz was 0.98 μm.

In Example 3, the current density was set to 51 A/dm$^2$ and 2 A/dm$^2$, and the coulomb was set to 72 As/dm$^2$ and 8 As/dm$^2$ to form primary particles, while the current density was set to 31 A/dm$^2$, and the coulomb was set to 44 As/dm$^2$ to form secondary particles. The results showed that the average particle size of the primary particles and that of the secondary particles were 0.25 μm and 0.25 μm respectively, and some powder fall was observed at an insignificant level. The peeling strength under ordinary state was as high as 0.92 kg/cm, the heat resistance (peeling strength after heating at 180° C. for 48 hours) was as high as 0.73 kg/cm, and the surface roughness Rz was 1.02 μm.

In Example 4, the current density was set to 55 A/dm$^2$ and 3 A/dm$^2$, and the coulomb was set to 77 As/dm$^2$ and 12 As/dm$^2$ to form primary particles, while the current density was set to 24 A/dm$^2$, and the coulomb was set to 34 As/dm$^2$ to form secondary particles. The results showed that the average particle size of the primary particles and that of the secondary particles were 0.35 μm and 0.05 μm respectively, no powder fall was observed, the peeling strength under ordinary state was as high as 0.95 kg/cm, the heat resistance (peeling strength after heating at 180° C. for 48 hours) was as high as 0.73 kg/cm, and the surface roughness Rz was 1.20 μm.

In Example 5, the current density was set to 55 A/dm$^2$ and 3 A/dm$^2$, and the coulomb was set to 77 As/dm$^2$ and 12 As/dm$^2$ to form primary particles, while the current density was set to 28 A/dm$^2$, and the coulomb was set to 39 As/dm$^2$ to form secondary particles. The results showed that the average particle size of the primary particles and that of the secondary particles were 0.35 μm and 0.15 μm respectively, no powder fall was observed, the peeling strength under ordinary state was as high as 0.96 kg/cm, the heat resistance (peeling strength after heating at 180° C. for 48 hours) was as high as 0.74 kg/cm, and the surface roughness Rz was 1.20 μm.

In Example 6, the current density was set to 55 A/dm$^2$ and 3 A/dm$^2$, and the coulomb was set to 77 As/dm$^2$ and 12 As/dm$^2$ to form primary particles, while the current density was set to 31 A/dm$^2$, and the coulomb was set to 44 As/dm$^2$ to form secondary particles. The results showed that the average particle size of the primary particles and that of the secondary particles were 0.35 μm and 0.25 μm respectively, and some powder fall was observed at an insignificant level. The peeling strength under ordinary state was as high as 0.98 kg/cm, the heat resistance (peeling strength after heating at 180° C. for 48 hours) was as high as 0.75 kg/cm, and the surface roughness Rz was 1.51 μm.

In Example 7, the current density was set to 58 A/dm$^2$ and 4 A/dm$^2$, and the coulomb was set to 81 As/dm$^2$ and 16 As/dm$^2$ to form primary particles, while the current density was set to 24 A/dm$^2$, and the coulomb was set to 34 As/dm$^2$ to form secondary particles. The results showed that the average particle size of the primary particles and that of the secondary particles were 0.45 μm and 0.05 μm respectively, no powder fall was observed, the peeling strength under ordinary state was as high as 0.96 kg/cm, the heat resistance (peeling strength after heating at 181° C. for 48 hours) was as high as 0.71 kg/cm, and the surface roughness Rz was 1.21 μm.

In Example 8, the current density was set to 58 A/dm$^2$ and 4 A/dm$^2$, and the coulomb was set to 81 As/dm$^2$ and 16 As/dm$^2$ to form primary particles, while the current density was set to 28 A/dm$^2$, and the coulomb was set to 39 As/dm$^2$ to form secondary particles. The results showed that the average particle size of the primary particles and that of the secondary particles were 0.45 μm and 0.15 μm respectively, no powder fall was observed, the peeling strength under ordinary state was as high as 0.97 kg/cm, the heat resistance (peeling strength after heating at 180° C. for 48 hours) was as high as 0.72 kg/cm, and the surface roughness Rz was 1.54 μm.

In Example 9, the current density was set to 58 A/dm$^2$ and 4 A/dm$^2$, and the coulomb was set to 81 As/dm$^2$ and 16 As/dm$^2$ to form primary particles, while the current density was set to 31 A/dm$^2$, and the coulomb was set to 44 As/dm$^2$ to form secondary particles. The results showed that the average particle size of the primary particles and that of the secondary particles were 0.45 μm and 0.25 μm respectively, no powder fall was observed, the peeling strength under ordinary state was as high as 0.98 kg/cm, the heat resistance (peeling strength after heating at 180° C. for 48 hours) was as high as 0.74 kg/cm, and the surface roughness Rz was 1.60 μm.

On the other hand, Comparative Examples showed the following results. In Comparative Example 1, the current density was set to 47 A/dm$^2$ and 1 A/dm$^2$, and the coulomb was set to 66 As/dm$^2$ and 4 As/dm$^2$ to form primary particles, while the current density was set to 24 A/dm$^2$, and coulomb was set to 34 As/dm$^2$ to form secondary particles. The results showed that the average particle size of the primary particles and that of the secondary particles were 0.15 μm and 0.05 μm respectively, and no powder fall was observed, but the peeling strength under ordinary state was as low as 0.75 kg/cm, and the heat resistance (peeling strength after heating at 180° C. for 48 hours) was also as low as 0.70 kg/cm. In addition, the surface roughness Rz was as low as 0.87 μm. This copper foil for printed circuits was evaluated as inferior in general.

In Comparative Example 2, the current density was set to 47 A/dm$^2$ and 1 A/dm$^2$, and the coulomb was set to 66 As/dm$^2$ and 4 As/dm$^2$ to form primary particles, while the current density was set to 28 A/dm$^2$, and coulomb was set to 39 As/dm$^2$ to form secondary particles. The results showed that the average particle size of the primary particles and that of the secondary particles were 0.15 μm and 0.15 μm respectively, and no powder fall was observed, but the peeling strength under ordinary state was as low as 0.75 kg/cm, and the heat resistance (peeling strength after heating at 180° C. for 48 hours) was also as low as 0.70 kg/cm. In addition, the surface roughness Rz was as low as 0.88 μm. This copper foil for printed circuits was evaluated as inferior in general.

In Comparative Example 3, the current density was set to 47 A/dm$^2$ and 1 A/dm$^2$, and the coulomb was set to 66 As/dm$^2$ and 4 As/dm$^2$ to form primary particles, while the current density was set to 31 A/dm$^2$, and the coulomb was set to 44 As/dm$^2$ to form secondary particles. The results showed that the average particle size of the primary particles and that of the secondary particles were 1.5 μm and 0.25 μm respectively, powder fall was observed, the peeling strength under ordinary state was as low as 0.83 kg/cm, and the heat resistance (peeling strength after heating at 180° C. for 48 hours) was 0.72 kg/cm, which was comparable to the levels of Examples. In addition, the surface roughness Rz was 0.90 μm. This copper foil for printed circuits was evaluated as inferior in general.

In Comparative Example 4, the current density was set to 47 A/dm$^2$ and 1 A/dm$^2$, and the coulomb was set to 66 As/dm$^2$ and 4 As/dm$^2$ to form primary particles, while the current density was set to 34 A/dm$^2$, and the coulomb was set to 48 As/dm$^2$ to form secondary particles. The results showed that the average particle size of the primary particles was 0.15 μm, and that of the secondary particles was as large as 0.35 μm. Furthermore, a large amount of powder fall was observed. The peeling strength under ordinary state was as low as 0.85 kg/cm, and the heat resistance (peeling strength after heating at 180° C. for 48 hours) was 0.72 kg/cm, which was comparable to the levels of Examples. In addition, the surface roughness Rz was 0.91 μm. This copper foil for printed circuits was evaluated as inferior in general.

In Comparative Example 5, the current density was set to 51 A/dm$^2$ and 2 A/dm$^2$, and the coulomb was set to 72 As/dm$^2$ and 8 As/dm$^2$ to form primary particles, while the current density was set to 34 A/dm$^2$, and coulomb was set to 48 As/dm$^2$ to form secondary particles. The results showed that the average particle size of the primary particles was 0.25 μm, and that of the secondary particles was as large as 0.35 μm. Furthermore, a large amount of powder fall was observed. The peeling strength under ordinary state was 0.93 kg/cm, and the heat resistance (peeling strength after heating at 180° C. for 48 hours) was 0.72 kg/cm, both of which were comparable to the levels of Examples. In addition, the surface roughness Rz was 1.15 μm. This copper foil for printed circuits was evaluated as inferior in general.

In Comparative Example 6, the current density was set to 55 A/dm$^2$ and 3 A/dm$^2$, and the coulomb was set to 77 As/dm$^2$ and 12 As/dm$^2$ to form primary particles, while the current density was set to 34 A/dm$^2$, and the coulomb was set to 48 As/dm$^2$ to form secondary particles. The results showed that the average particle size of the primary particles was 0.35 μm, and that of the secondary particles was as large as 0.35 μm. Furthermore, a large amount of powder fall was observed. The peeling strength under ordinary state was 0.98 kg/cm, and the heat resistance (peeling strength after heating at 180° C. for 48 hours) was 0.73 kg/cm, both of which were comparable to the levels of Examples. In addition, the surface roughness Rz was 1.50 μm. This copper foil for printed circuits was evaluated as inferior in general.

In Comparative Example 7, the current density was set to 58 A/dm$^2$ and 4 A/dm$^2$, and the coulomb was set to 81 As/dm$^2$ and 16 As/dm$^2$ to form primary particles, while the current density was set to 34 A/dm$^2$, and the coulomb was set to 48 As/dm$^2$ to form secondary particles. The results showed that the average particle size of the primary particles was 0.45 μm, and that of the secondary particles was as large as 0.35 μm. Furthermore, a large amount of powder fall was observed. The peeling strength under ordinary state was 0.98 kg/cm, and the heat resistance (peeling strength after heating at 180° C. for 48 hours) was 0.77 kg/cm, both of which were comparable to the levels of Examples. In addition, the surface roughness Rz was as large as 1.55 μm. This copper foil for printed circuits was evaluated as inferior in general.

In Comparative Example 8, the current density was set to 51 A/dm$^2$ and 2 A/dm$^2$, and the coulomb was set to 72 As/dm$^2$ and 8 As/dm$^2$ to form primary particles only, while no secondary particles were formed. The results showed that the average particle size of the primary particles was 0.25 μm, no powder fall was observed, and the peeling strength under ordinary state was 0.94 kg/cm, which was comparable to the levels of Examples, but the heat resistance (peeling strength after heating at 180° C. for 48 hours) was significantly reduced to 0.54 kg/cm. In addition, the surface roughness Rz was 1.10 μm. This copper foil for printed circuits was evaluated as inferior in general.

Comparative Example 9 shows a conventional example only having a roughening secondary particle layer with no primary particle size. That is, for this case, the current density was set to 50 A/dm$^2$, and the coulomb was set to 25 As/dm$^2$ to form secondary particles. The results showed that the average particle size of the secondary particles was as large as 0.60 μm, and a large amount of powder fall was observed. The peeling strength under ordinary state was 0.90 kg/cm, and the heat resistance (peeling strength after heating at 180° C. for 48 hours) was 0.73 kg/cm, both of which were comparable to the levels of the Examples. In addition, the surface roughness Rz was 0.78 μm. This represents an example having problems such as a large amount of powder fall, and thus this copper foil for printed circuits was evaluated as inferior in general.

As clearly shown by comparing Examples with Comparative Examples described above, the copper foil according to the present invention prepared by forming a roughening primary particle layer of copper on a surface of the copper foil, and then forming a roughening secondary particle layer based on ternary alloy composed of copper, cobalt and nickel on the roughening primary particle layer, in which the average particle size of the roughening primary particle layer is 0.25 to 0.45 μm and the average particle size of the roughening secondary particles layer based on ternary alloy composed of copper, cobalt and nickel is 0.05 to 0.25 μm, is found to be capable of having superior effects to inhibit a phenomenon called powder fall and uneven treatment, increasing its peeling strength, and improving its heat resistance.

The object of the present invention is to provide copper foil for printed circuits capable of having superior effects to inhibit uneven treatment and a phenomenon called powder fall in which roughening particles grown in a dendritic structure come off from the surface of the copper foil when forming a roughening secondary particle layer composed of copper-cobalt-nickel alloy plating (roughening treatment), and further having increased peeling strength and improved heat resistance. In addition, since an amount of abnormally grown particles will be decreased, its particle size will be uniform, and its whole surface will be covered; its etching properties will be improved, and a high-precision circuit can be formed. Therefore, it is useful as a printed circuit material for electronic equipment with increasingly downsized and highly integrated semiconductor devices.

The invention claimed is:

1. A method for producing a copper foil for printed circuits comprising performing a first roughening treatment to form a roughening primary particle layer of copper on a surface of a copper foil, and then performing a second roughening treatment to deposit a roughening secondary particle layer based on ternary alloy composed of copper, cobalt and nickel on the roughening primary particle layer; wherein the surface is to be bonded to a resin base layer, the average particle size of the roughening primary particle layer is 0.25 to 0.45 μm, and the average particle size of the roughening secondary particle layer based on ternary alloy composed of copper, cobalt and nickel is 0.05 to 0.25 μm.

2. The method for producing a copper foil for printed circuits according to claim 1, wherein the roughening primary particle layer and the roughening secondary particle layer are electroplated layers.

3. The method for producing a copper foil for printed circuits according to claim 2, wherein the roughening secondary particle layer includes one or more dendritic particles grown on the roughening primary particle layer.

4. The method for producing a copper foil for printed circuits according to claim 3, wherein a bonding strength of the roughening primary particle layer and the roughening secondary particle layer is 0.80 kg/cm or more.

5. The method for producing a copper foil for printed circuits according to claim 4, wherein the bonding strength of the roughening primary particle layer and the roughening secondary particle layer is 0.90 kg/cm or more.

6. The method for producing a copper foil for printed circuits according to claim 5, wherein a roughness, Rz, of a surface formed by the roughening primary particle layer and the roughening secondary particle layer is 1.5 μm or less.

7. The method for producing a copper foil for printed circuits according to claim 5, wherein a roughness, Rz, of a surface formed by the roughening primary particle layer and the roughening secondary particle layer is 1.0 μm or less.

8. The method for producing a copper foil according to claim 1, wherein the roughening secondary particle layer includes one or more dendritic particles grown on the roughening primary particle layer.

9. The method for producing a copper foil according to claim 1, wherein a bonding strength of the roughening primary particle layer and the roughening secondary particle layer is 0.80 kg/cm or more.

10. The method for producing a copper foil according to claim 9, wherein the bonding strength of the roughening primary particle layer and the roughening secondary particle layer is 0.90 kg/cm or more.

11. The method for producing a copper foil according to claim 1, wherein a roughness, Rz, of a surface formed by the roughening primary particle layer and the roughening secondary particle layer is 1.5 μm or less.

12. The method for producing a copper foil according to claim 1, wherein a roughness, Rz, of a surface formed by the roughening primary particle layer and the roughening secondary particle layer is 1.0 μm or less.

13. The method for producing a copper foil for printed circuits according to claim 1, wherein the average particle size of the roughening primary particle layer is 0.35 to 0.45 μm.

14. The method for producing a copper foil for printed circuits according to claim 1, wherein the average particle size of the roughening secondary particle layer is 0.15 to 0.25 μm.

15. The method for producing a copper foil for printed circuits according to claim 1, wherein the method further comprises depositing a cobalt-nickel alloy plated layer as a heatproof layer on the roughening secondary particle layer.

16. The method for producing a copper foil for printed circuits according to claim 15, wherein a total deposited amount of cobalt in the roughening secondary particle layer and the cobalt-nickel alloy plated layer is 300 to 4000 μg/dm$^2$.

17. The method for producing a copper foil for printed circuits according to claim 15, wherein a total deposited amount of cobalt in the roughening secondary particle layer and the cobalt-nickel alloy plated layer is 300 to 3500 μg/dm$^2$.

18. The method for producing a copper foil for printed circuits according to claim 1, wherein the method further comprises depositing a zinc-nickel alloy plated layer as a heatproof layer on the roughening secondary particle layer.

19. The method for producing a copper foil for printed circuits according to claim 18, wherein a total deposited amount of cobalt in the roughening secondary particle layer is 300 to 4000 μg/dm$^2$.

20. The method for producing a copper foil for printed circuits according to claim 18, wherein a total deposited amount of nickel in the roughening secondary particle layer, and the zinc-nickel alloy plated layer does not exceed 1500 μg/dm$^2$.

21. The method for producing a copper foil for printed circuits according to claim 18, wherein a total deposited amount of cobalt in the roughening secondary particle layer is 300 to 3500 μg/dm$^2$.

22. The method for producing a copper foil for printed circuits according to claim 18, wherein a total deposited amount of nickel in the roughening secondary particle layer, and the zinc-nickel alloy plated layer does not exceed 1000 μg/dm$^2$.

23. The method for producing a copper foil for printed circuits according to claim 1, wherein the method further comprises depositing a cobalt-nickel alloy plated layer as a heatproof layer on the roughening secondary particle layer and a zinc-nickel alloy plated layer as a heatproof layer on the cobalt-nickel alloy plated layer.

24. The method for producing a copper foil for printed circuits according to claim 23, wherein a total deposited amount of nickel in the roughening secondary particle layer, the cobalt-nickel alloy plated layer, and the zinc-nickel alloy plated layer does not exceed 1500 µg/dm$^2$.

25. The method for producing a copper foil for printed circuits according to claim 23, wherein a total deposited amount of nickel in the roughening secondary particle layer, the cobalt-nickel alloy plated layer, and the zinc-nickel alloy plated layer does not exceed 1000 µg/dm$^2$.

26. The method for producing a copper foil for printed circuits according to claim 1, wherein 10 to 30 mg/dm$^2$ of copper, 100 to 3000 µg/dm$^2$ of cobalt, and 50 to 500 µg/dm$^2$ of nickel are deposited during said second roughening treatment in the roughening secondary particle layer.

\* \* \* \* \*